United States Patent
Groth et al.

(10) Patent No.: US 9,019,113 B2
(45) Date of Patent: Apr. 28, 2015

(54) CIRCUIT, SYSTEM AND/OR METHOD FOR DETECTING AN ELECTRICAL CONNECTION BETWEEN AN ELECTRICAL DEVICE AND A POWER SUPPLY

(75) Inventors: Jim Groth, Poplar Grove, IL (US); Christopher Marszalek, Plainfield, IL (US); Daniel Horvath, Marseilles, IL (US); Kerry Berland, Chicago, IL (US); Try Ty, Chicago, IL (US); Mark Kmiecik, Chicago, IL (US)

(73) Assignee: Sennco Solutions, Inc., Plainfield, IL (US)

( * ) Notice: Subject to any disclaimer, the term of this patent is extended or adjusted under 35 U.S.C. 154(b) by 1026 days.

(21) Appl. No.: 12/587,749

(22) Filed: Oct. 13, 2009

(65) Prior Publication Data

US 2011/0084689 A1   Apr. 14, 2011

(51) Int. Cl.
G01R 19/22 (2006.01)
G08B 21/00 (2006.01)
G01R 31/02 (2006.01)

(52) U.S. Cl.
CPC .................................. G01R 31/026 (2013.01)

(58) Field of Classification Search
CPC ....................... G08B 13/1445; G08B 13/1454
See application file for complete search history.

(56) References Cited

U.S. PATENT DOCUMENTS

| | | | |
|---|---|---|---|
| 3,940,692 A * | 2/1976 | Neilson | 324/76.17 |
| 5,189,396 A * | 2/1993 | Stobbe | 340/541 |
| 5,625,348 A * | 4/1997 | Farnsworth et al. | 340/690 |
| 5,861,807 A | 1/1999 | Leyden et al. | |
| 6,027,277 A | 2/2000 | Leyden et al. | |
| 6,130,607 A * | 10/2000 | McClanahan et al. | 340/436 |
| 7,154,039 B1 | 12/2006 | Marszalek et al. | |
| 7,202,417 B2 | 4/2007 | Marszalek et al. | |
| 7,202,786 B2 | 4/2007 | Marszalek et al. | |
| 7,223,917 B1 | 5/2007 | Marszalek et al. | |
| 7,385,522 B2 | 6/2008 | Belden, Jr. et al. | |
| 7,387,003 B2 | 6/2008 | Marszalek et al. | |
| 7,487,652 B2 | 2/2009 | Marszalek et al. | |
| 7,504,944 B2 | 3/2009 | Marszalek et al. | |
| 7,667,601 B2 * | 2/2010 | Rabinowitz et al. | 340/568.2 |

(Continued)

OTHER PUBLICATIONS

"The Next Generation in Display Security Vantage", Se-Kure Controls, Inc. Flyer.

(Continued)

*Primary Examiner* — Benjamin C Lee
*Assistant Examiner* — Rajsheed Black-Childress
(74) *Attorney, Agent, or Firm* — Patents + TMS, P.C.

(57) ABSTRACT

A circuit, a system and/or a method detect a passive electrical connection and/or an active electrical connection between an electrical device and a power supply. An integrity of the electrical connection between the electrical device and the power supply is monitored to determine if the electrical device may have access to power and/or to determine if the electrical device may be secure while on display. A high frequency AC signal is modulated onto a positive power rail between the electrical device and the power supply. Capacitance circuitry of the electrical device may remove the high frequency signal from the positive power rail. An absence of the high frequency signal on the positive power rail indicates that the electrical connection exists between the electrical device and the power supply. A presence of the high frequency signal on the positive power rail indicates that the electrical connection does not exist between the electrical device and the power supply.

28 Claims, 3 Drawing Sheets

(56) References Cited

U.S. PATENT DOCUMENTS

| | | |
|---|---|---|
| 2003/0099574 A1* | 5/2003 | Bentsen et al. ............ 422/82.07 |
| 2003/0155904 A1* | 8/2003 | Zou ................................ 324/95 |
| 2005/0263315 A1 | 12/2005 | Marszalek et al. |
| 2005/0264418 A1 | 12/2005 | Marszalek et al. |
| 2005/0268674 A1 | 12/2005 | Marszalek et al. |
| 2006/0017584 A1* | 1/2006 | Yanagida et al. ............ 340/652 |
| 2006/0086160 A1 | 4/2006 | Marszalek et al. |
| 2006/0170549 A1 | 8/2006 | Belden, Jr. et al. |
| 2006/0174812 A1 | 8/2006 | Marszalek et al. |
| 2007/0113973 A1 | 5/2007 | Marszalek et al. |
| 2007/0125472 A1 | 6/2007 | Marszalek et al. |
| 2007/0125569 A1 | 6/2007 | Marszalek et al. |
| 2007/0152819 A1 | 7/2007 | Marszalek et al. |
| 2007/0169956 A1 | 7/2007 | Marszalek et al. |
| 2008/0061975 A1 | 3/2008 | Belden, Jr. et al. |
| 2008/0204239 A1 | 8/2008 | Marszalek et al. |
| 2009/0058643 A1 | 3/2009 | Groth |
| 2009/0266963 A1 | 10/2009 | Marszalek et al. |

OTHER PUBLICATIONS

"Se-Kure Controls: Detailed Descriptions of Items Too New for Catalog", Se-Kure Controls, Inc. Website, http://www.se-kure.com/new—listings.htm.

"Se-Kure Controls: 4-Port and One-on-One Alarms", Se-Kure Controls, Inc. Website, http://www.se-kure.com/page7.htm.

"InVue Security Products USB Sensors", Promotional Flyer.

\* cited by examiner

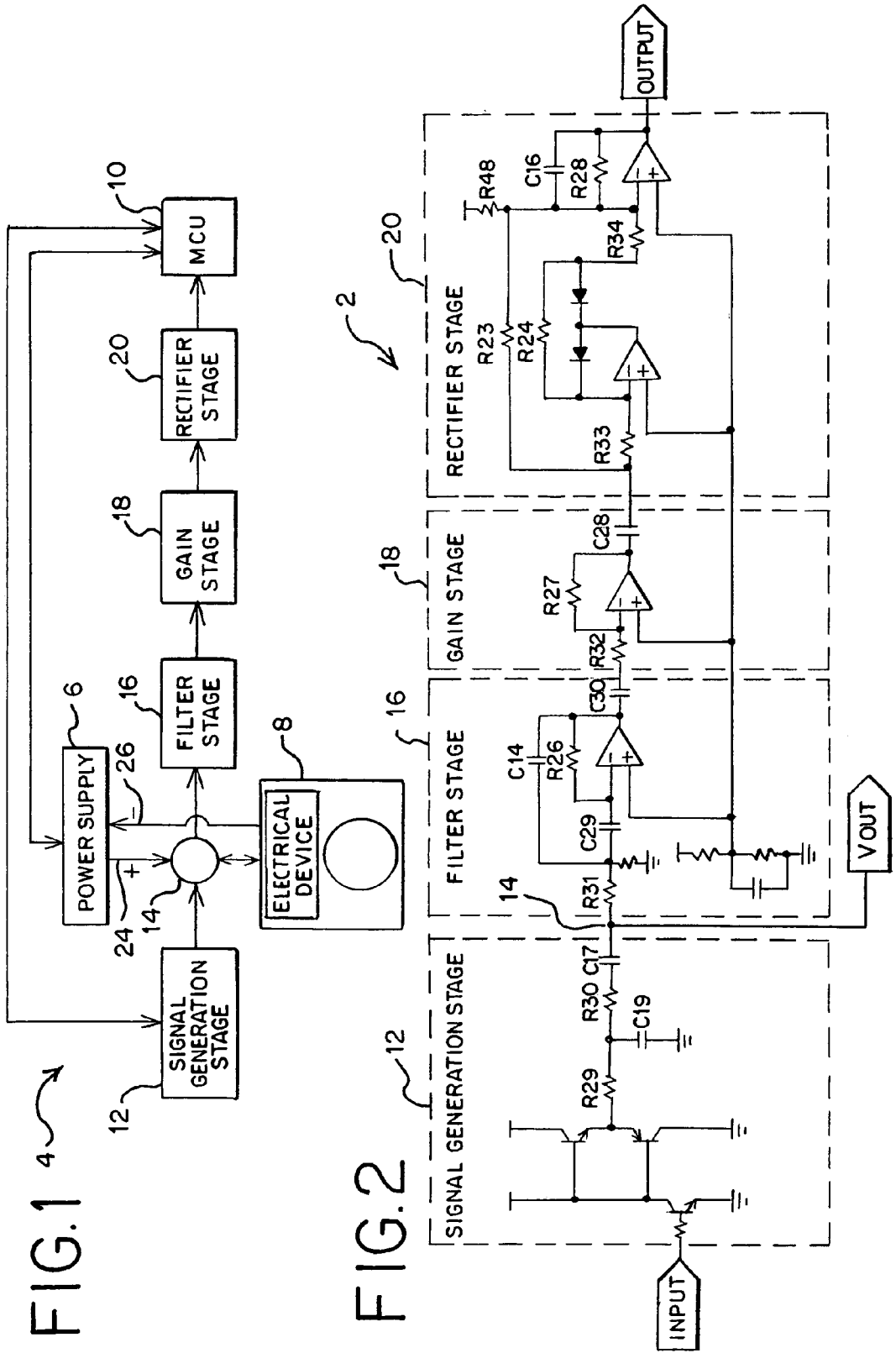

CIRCUIT, SYSTEM AND/OR METHOD FOR DETECTING AN ELECTRICAL CONNECTION BETWEEN AN ELECTRICAL DEVICE AND A POWER SUPPLY

BACKGROUND OF THE INVENTION

The present invention generally relates to a circuit, a system and/or a method for detecting an electrical connection between an electrical device and a power supply. More specifically, the present invention relates to a circuit, a system and/or a method that may monitor an integrity of the electrical connection between the electrical device and the power supply to determine if the electrical device may have access to power and/or to determine if the electrical device is secure. The circuit, the system and/or the method may have a power cable that may have a positive power rail and a ground power rail to electrically connect the electrical device to the power supply. The circuit, the system and/or the method may modulate a high frequency AC signal onto the positive power rail and may monitor the positive power rail to determine if the power cable is securely and/or electrically connected between the electrical device and the power supply.

The circuit, the system and/or the method may be programmed to determine if the electrical device is electrically connected to the power supply by detecting for presence or absence of the high frequency AC signal that may be modulated onto the positive power rail. The presence and/or the absence of the high frequency AC signal on the positive power rail may be directly related to the electrical connection or lack thereof between the power supply and the electrical device. The electrical connection may be required to provide power to and/or to secure the electrical device to maintain an operational functionality of the electrical device in a specific location, such as, for example, on and/or near a display in a retail store environment. Therefore, monitoring and/or maintaining the electrical connection may be desirable to both a user and/or a retailer of the electrical device.

It is generally known that retailers of a variety of electronic articles use security systems to secure samples of the electronic articles to displays. Further, the retailers use power cables between the displays and/or the security systems and the samples to provide power to the samples while on display. Many samples require power connections to allow an operational interaction between a consumer and the samples. Further, many samples require proprietary plugs to electrically connect the sample to the power supply in the display and/or the security system.

As a result, known security systems are provided and/or are used by retailers to provide power to the samples over a power cable and/or to monitor the existence of an electrical connection between the security system and the sample. However, known security systems simply detect whether the sample is placing a load on the power supply by drawing power from the power supply. If an electrical connection exists between the sample and the security system, the sample may place a load on the power supply and may draw power from the power supply. If an electrical connection does not exist between the sample and the security system, the sample may not place a load on the power supply and, therefore, may not draw power from the power supply. The known security systems typically employ a current and/or a load sensing circuit to determine if the electrical connection exists.

However, known security systems are often inaccurate and do not operate effectively with a wide variety of samples. For example, many samples require little power and, therefore, place minute loads on the power supply. Current and/or load sensing circuits may be unreliable in situations in which a small load or no load is placed on the power supply. Further, many samples may be powered off which may reduce and/or may eliminate the load on the power supply. Even further, if the power supply fails to provide power over the cable, the known security systems are unable to detect the presence of the connection between the security system and the sample using the current and/or the load sensing circuits. As such, for any number of reasons, the samples may or may not draw detectable amounts of power from the power supply when connected. The connection may be active, and power may be transmitted over the connection. Alternatively, the connection may be passive, and power may not be transmitted over the connection. Therefore, the samples may have a passive electrical connection or an active electrical connection with the power supply that may require detection.

A need, therefore, exists for a circuit, a system and/or a method for detecting an electrical connection between an electrical device and a power supply. Further, a need exists for a circuit, a system and/or a method for detecting an electrical connection between an electrical device and a power supply wherein the electrical device draws little power or no power from the power supply. Still further, a need exists for a circuit, a system and/or a method for detecting an electrical connection between an electrical device and a power supply wherein the power supply provides little power or no power to the electrical device. Still further, a need exists for a circuit, a system and/or a method for detecting an electrical connection between an electrical device and a power supply wherein the electrical device has a capacitance between a positive power rail and a negative power rail of the electrical device to provide a constant DC power and/or a steady DC power to the electrical device.

Still further, a need exists for a circuit, a system and/or a method for detecting an electrical connection between an electrical device and a power supply to secure the electrical device to a display. Still further, a need exists for a circuit, a system and/or a method for detecting an electrical connection between an electrical device and a power supply to maintain functionality of the electrical device. Still further, a need exists for a circuit, a system and/or a method for detecting an electrical connection between an electrical device and a power supply to determine if a power cable is secured between the electrical device and the power supply.

SUMMARY OF THE INVENTION

The present invention generally relates to a circuit, a system and/or a method for detecting an electrical connection between an electrical device and a power supply. More specifically, the present invention relates to a circuit, a system and/or a method that may monitor an integrity of the electrical connection between the electrical device and the power supply. The circuit, the system and/or the method may modulate a high frequency AC signal onto a positive power rail that may be in communication with a power cable that may be connected between the power supply and the electrical device.

Provided that the electrical device is electrically connected to the power supply via the positive power rail and a ground power rail of the power cable, a capacitance of the electrical device may remove and/or may filter the high frequency AC signal from the positive power rail. Therefore, the circuit, the system and/or the method may detect an absence of the high frequency AC signal. Detection of the absence of the high frequency AC signal may indicate that both the positive power rail and the ground power rail of the power cable are electrically connected between the electrical device and the power supply. Accordingly, they system 4 may determine that the power cable is secured between the electrical device and the power supply.

Provided that the electrical device is not electrically connected to the power-supply via the positive power rail and/or the ground power rail of the power cable, the capacitance of the electrical device may not remove and/or may not filter the high frequency AC signal from the positive power rail. Therefore, the circuit, the system and/or the method may detect a presence of the high frequency AC signal. Detection of the presence of the high frequency AC signal may indicate that the positive power rail and/or the ground power rail of the power cable are not electrically connected between the electrical device and the power supply. Accordingly, system may determine that the power cable may not be secured between the electrical device and the power supply. Alternatively, detection of the presence of the high frequency AC signal may indicate that the power cable, the power supply and/or the electrical device may be damaged. Moreover, detection of the presence of the high frequency AC signal may indicate that the electrical device may not have enough capacitance to remove and/or to filter the high frequency AC signal from the positive power rail. In instances, wherein the device may not have enough capacitance to remove and/or to filter the high frequency AC signal, the system may be programmed to modulate another high frequency AC signal onto the positive power rail that may be removed and/or filtered by the capacitance of the electrical device.

To this end, in an embodiment of the present invention, a circuit for detecting an electrical connection between an electrical device and a power supply wherein the system modulates a high frequency signal onto a positive power rail between the electrical device and the power supply and further wherein the circuit monitors the positive power rail to determine if the high frequency signal is removed from the positive power rail by the electrical device is provided. The circuit has a signal generation stage to generate the high frequency signal. Further, the circuit has a modulation stage to connect the signal generation stage to the positive power rail to transmit the high frequency signal onto the positive power rail between the electrical device and the power supply. Still further, the circuit has a filter stage connected to the positive power rail to filter frequencies other than the high frequency signal from the positive power rail and to transmit the high frequency signal from the positive power rail. Moreover, the circuit has a rectifier stage to convert the high frequency signal transmitted from the positive power rail to a known DC level.

In an embodiment, the signal generation stage reduces a magnitude the high frequency signal.

In an embodiment, the circuit has a short circuit between the signal generation stage and the positive power rail.

In an embodiment, the circuit has an open circuit between the signal generation stage and the positive power rail.

In an embodiment, the circuit has a multi-feedback band-pass filter associated with the filter stage wherein the multi-feedback band-pass filter has an op-amp to pass a range of frequencies to the rectifier stage wherein the range of frequencies has a frequency of the high frequency signal.

In an embodiment, the circuit has a gain stage between the filter stage and the rectifier stage wherein the gain stage has an active gain-only op-amp to amplify a magnitude of the high frequency signal.

In an embodiment, the circuit has an active full-wave rectifier associated with the rectifier stage wherein the active full-wave rectifier converts the high frequency signal to a corresponding DC level.

In an embodiment, the circuit has a microcontroller unit to integrate the stages of the circuit.

In an embodiment, the circuit has a microcontroller unit programmed to identify the electrical connection between the power supply and the electrical device based upon the output of the rectifier stage.

In another embodiment, a system for detecting an electrical connection between an electrical device and a power supply wherein a power cable is used to electrically connect a positive power rail and a ground power rail between the electrical device and the power supply wherein the power supply transmits DC power to the electrical device and further wherein the electrical device has capacitance circuitry to remove a high frequency signal transmitted to the electrical device via the positive power rail when the electrical device is electrically connected to the power supply is provided. The system has a microcontroller unit that generates the high frequency signal. Moreover, the system has a circuit integrated with the microcontroller unit wherein the circuit changes a magnitude of the high frequency signal and modulates the high frequency signal onto the positive power rail between the power supply and the electrical device wherein the circuit removes frequencies other than the high frequency signal from the positive power rail wherein the circuit converts the high frequency signal on the positive power rail to a known DC level and outputs the known DC level to the microcontroller unit wherein the circuit outputs a nominal level to the microcontroller unit when the high frequency signal is removed by the capacitance circuitry of the electrical device wherein the microcontroller unit detects an absence of the electrical connection between the power supply and the electrical device when the output of the circuit is the known DC level wherein the microcontroller unit detects a presence of the electrical connection between the power supply and the electrical device when the output of the circuit is the nominal level.

In an embodiment, the system has a threshold value between the known DC level and the nominal level programmed into the microcontroller unit for detecting the electrical connection between the power supply and the electrical device.

In an embodiment, the circuit amplifies the high frequency signal on the positive power rail before converting the high frequency signal to the known DC level.

In an embodiment, the high frequency signal has a peak-to-peak magnitude that is less than a nominal value of the DC power transmitted from the power supply to the electrical device.

In an embodiment, the system has an alarm initiated by the microcontroller unit following detection of the electrical connection between the power supply and the electrical device.

In another embodiment, a method for detecting an electrical connection between a power supply and an electrical device with a microcontroller unit by monitoring a positive power rail between the power supply and the electrical device is provided. The method has the step of generating a high frequency signal. Further, the method has the step of modulating the high frequency signal onto the positive power rail. Still further, the method has the step of filtering the high frequency signal on the positive power rail to detect the high frequency signal on the positive power rail. Moreover, the method has the step of rectifying the high frequency signal to convert the high frequency signal to a first DC level.

In an embodiment, the method has the step of amplifying the high frequency signal.

In an embodiment, the method has the step of smoothing the high frequency signal.

In an embodiment, the method has the step outputting the first DC level which provides an indication that the electrical connection does not exist between the power supply and the electrical device.

In an embodiment, the method has the step of outputting a second DC level if the high frequency signal is removed by the electrical device wherein the second DC level provides an indication of the electrical connection between the power supply and the electrical device.

In an embodiment, the method has the step of initiating an alarm after detecting the first DC level.

It is, therefore, an advantage of the present invention to provide a circuit, a system and/or a method for detecting an electrical connection between an electrical device and a power supply.

Another advantage of the present invention is to provide a system and/or a method for detecting an electrical connection between an electrical device and a power supply wherein the electrical device draws little power or no power from the power supply.

And, another advantage of the present invention is to provide a circuit, a system and/or a method for detecting an electrical connection between an electrical device and a power supply wherein the power supply provides little power or no power to the electrical device.

Yet another advantage of the present invention is to provide a circuit, a system and/or a method for detecting an electrical connection between an electrical device and a power supply wherein the electrical device has a capacitance between a positive power rail and a negative power rail of the electrical device to provide a constant DC power and/or a steady DC power to the electrical device.

A further advantage of the present invention is to provide a circuit, a system and/or a method for detecting an electrical connection between an electrical device and a power supply to secure the electrical device to a display.

Moreover, an advantage of the present invention is to provide a circuit, a system and/or a method for detecting an electrical connection between an electrical device and a power supply to maintain functionality of the electrical device.

And, another advantage of the present invention is to provide a circuit, a system and/or a method for detecting an electrical connection between an electrical device and a power supply to determine if a power cable is secured between the electrical device and the power supply.

Yet another advantage of the present invention is to provide a circuit, a system and/or a method for detecting an electrical connection between an electrical device and a power supply that may modulate a high frequency AC signal onto a positive power rail that may be in communication with a power cable that may be connected between the power supply and the electrical device.

Another advantage of the present invention is to provide a circuit, a system and/or a method for detecting an electrical connection between an electrical device and a power supply wherein a capacitance of the electrical device may remove and/or may filter the high frequency AC signal from the positive power rail.

Yet another advantage of the present invention is to provide a circuit, a system and/or a method for detecting an electrical connection between an electrical device and a power supply that may detect an absence of the high frequency AC signal.

A still further advantage of the present invention is to provide a circuit, a system and/or a method for detecting an electrical connection between an electrical device and a power supply that may detect that both the positive power rail and the ground power rail of the power cable are secured and/or electrically connected between the electrical device and the power supply.

Another advantage of the present invention is to provide a circuit, a system and/or a method for detecting an electrical connection between an electrical device and a power supply that may determine if the power cable may be plugged into the electrical device and/or the power supply.

Yet another advantage of the present invention is to provide a circuit, a system and/or a method for detecting an electrical connection between an electrical device and a power supply wherein the capacitance of the electrical device may not remove and/or may not filter the high frequency AC signal from the positive power rail.

And, another advantage of the present invention is to provide a circuit, a system and/or a method for detecting an electrical connection between an electrical device and a power supply that may detect a presence of the high frequency AC signal.

Moreover, an advantage of the present invention is to provide a circuit, a system and/or a method for detecting an electrical connection between an electrical device and a power supply that may detect whether the positive power rail and/or the ground power rail of the power cable are not secured and/or electrically connected between the electrical device and the power supply.

And, another advantage of the present invention is to provide a circuit, a system and/or a method for detecting an electrical connection between an electrical device and a power supply when the electrical connection is passive, and power is not transmitted from the power supply to the electrical device.

Yet another advantage of the present invention is to provide a circuit, a system and/or a method for detecting an electrical connection between an electrical device and a power supply when the electrical connection is active, and power is transmitted from the power supply to the electrical device.

Moreover, an advantage of the present invention is to provide a circuit, a system and/or a method for detecting an electrical connection between an electrical device and a power supply without using a load and/or a current sensing circuit.

Additional features and advantages of the present invention are described in, and will be apparent from, the detailed description of the presently preferred embodiments and from the drawings.

BRIEF DESCRIPTION OF THE DRAWINGS

FIG. 1 illustrates a black box diagram of a system for detecting an electrical connection between an electrical device and a power supply in an embodiment of the present invention.

FIG. 2 illustrates a circuit for detecting an electrical connection between an electrical device and a power supply in an embodiment of the present invention.

DETAILED DESCRIPTION OF THE PRESENTLY PREFERRED EMBODIMENTS

Figure 3:
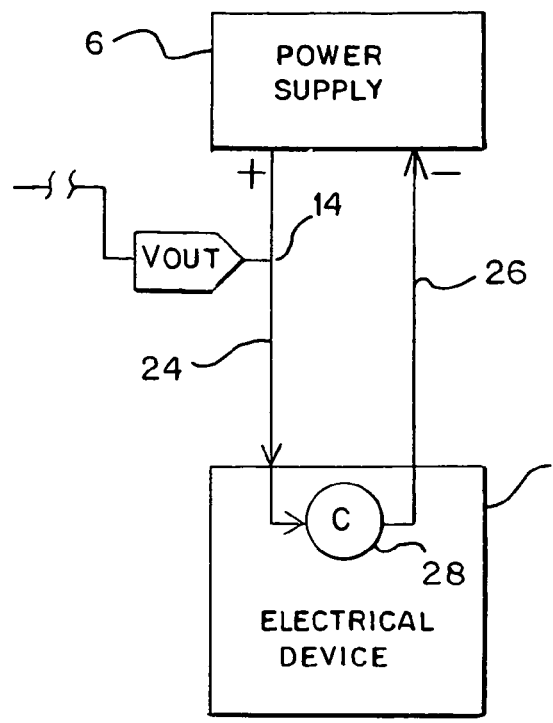
FIG. 3 illustrates a black box diagram of an electrical connection between an electrical device and a power supply in an embodiment of the present invention.

The present invention generally relates to a circuit, a system and/or a method for detecting an electrical connection between an electrical device and a power supply. More specifically, the present invention relates to a circuit, a system and/or a method that may monitor an integrity of the electrical connection between the electrical device and the power supply.

Referring now to the drawings wherein like numerals refer to like parts, FIGS. 1 and 2 illustrate a circuit 2 and/or a system 4 for detecting an electrical connection between an electrical device 8 and a power supply 6. In an embodiment, the electrical device 8 may be a portable electronic device, such as, for example, a cellular telephone, an mp3 player, a camera, a camcorder, a PDA, a gaming device, a handheld GPS system, a laptop computer, a satellite radio, a remote control, an e-book reader and/or the like. The electrical device 8 may be on display and/or may be used, manipulated, tested and/or transported by consumers in an environment, such as, for example, a retail store. The present invention should not be deemed as limited to a specific embodiment of the electrical device 8. The electrical device 8 may be any electrical device as known to one having ordinary skill in the art.

Figure 4:
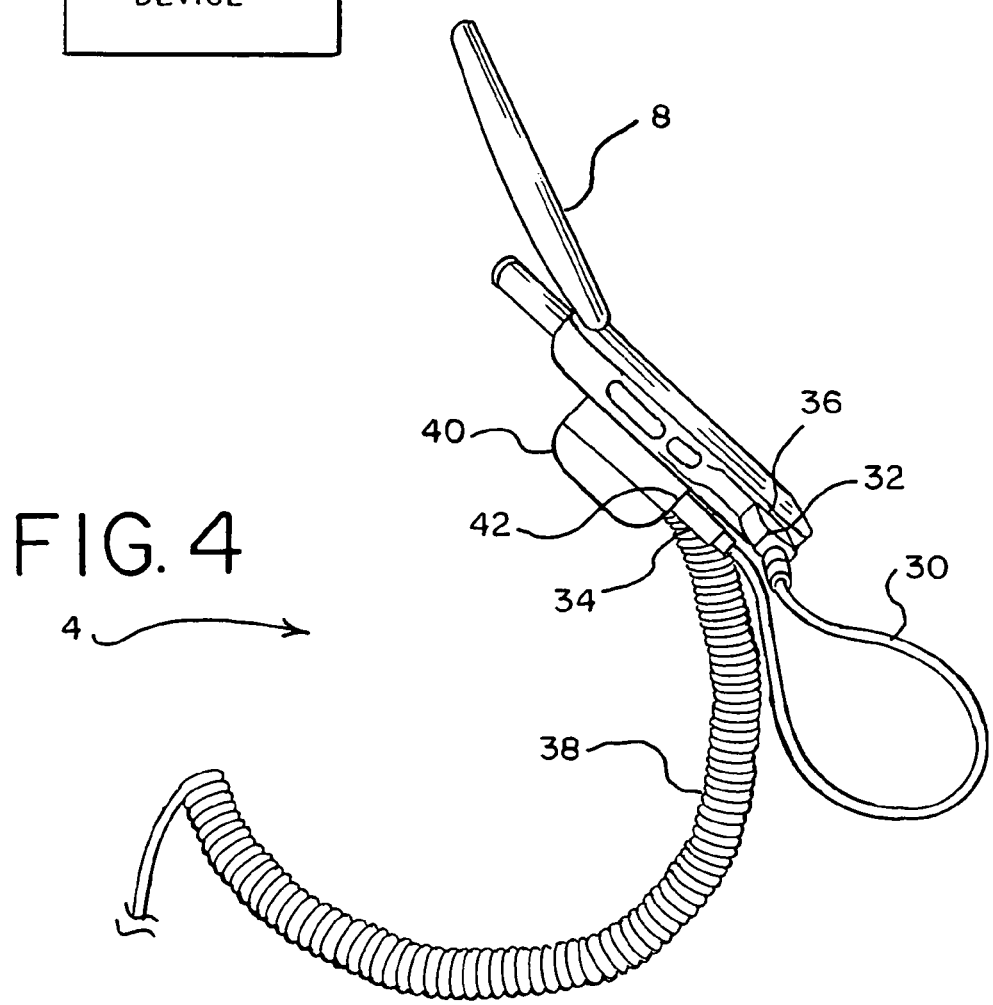
FIG. 4 illustrates a side view of a power cable connected between an electrical device and a power supply in an embodiment of the present invention.

As illustrated in FIG. 4, the electrical device 8 may be secured to a display (not shown) and/or a security system (not shown) with an electrical and/or a mechanical security tether 38. The security tether 38 may have a head unit 40 which may attach to the electrical device 8 and/or may connect the electrical device 8 to the security tether 38. The security tether 38 may transmit power and/or information between the electrical device and the security system which may be situated at or beyond the display. The security tether 38 may transmit power between the power supply 6 and the electrical device 8. Further, the head unit 40 may have a power port 42 to transmit power to the electrical device 8.

The electrical device 8 may have a power port 36 to receive a power cable 30. The power cable 30 may have a first end 32 and a second end 34 that may be positioned opposite to the first end 32. The first end 32 of the power cable 30 may be inserted into and/or connected to the power port 36 of the electrical device 8. The second end 34 of the power cable 30 may be connected to the power port 42 of the head unit 40. If the power cable 30 may be connected between the electrical device 8 and the head unit 40, an electrical connection may exist between the electrical device 8 and the power supply 6. The electrical connection may be used to transmit power through a positive power rail 24 of the electrical device 8 and through a ground power rail 26 of the electrical device 8.

As shown in FIG. 3, the electrical device 8 may have a capacitance circuitry 28 that may be situated between the positive power rail 24 and the ground power rail 26. The capacitance circuitry 28 may act as a low-pass filter that may condition DC power that may be transmitted to the electrical device 8 via the positive power rail 24. Specifically, the capacitance circuitry 28 may remove any high frequency oscillations on the positive power rail 24 that may damage the electrical device 8 and/or that may negatively effect a battery and/or circuitry of the electrical device 8 to prevent operation of the electrical device 8. The present invention should not be deemed as limited to a specific embodiment of the capacitance circuitry 28 of the electrical device 8.

As shown in FIG. 1, the system 4 may have a microcontroller unit 10 (hereinafter "the MCU 10") which may be a computer on an integrated circuit. The MCU 10 may be located within the security system and/or the display. The integrated circuit of the MCU 10 may provide power to the power supply 6. Alternatively, the integrated circuit of MCU 10 may have power supply circuitry which may act as the power supply 6. In an embodiment, the integrated circuit of the MCU 10 may have the circuit 2 of the present invention.

The circuit 2 of the system 4 may have stages which may be used to detect an electrical connection between the electrical device 8 and the power supply 6. In an embodiment, as shown in FIG. 2, the circuit 2 may be, for example, an integrated circuit that may be a component of the MCU 10. As shown in FIGS. 1 and 2, the stages may include a signal generation stage 12, a modulation stage 14, a filter stage 16, a gain stage 18 and/or a rectifier stage 20.

The system 4 may generate and may modulate the high frequency signal onto the positive power rail 24. The system 4 may detect if the high frequency signal may be removed from the positive power rail 24 by the capacitance circuitry 28 of the electrical device 8. If the system 4 detects a presence of the high frequency signal on the positive power rail 24, then the electrical device 8 may not be electrically connected to the power supply 6. Alternatively, if the high frequency signal is present on the positive power rail 24 and if the electrical device 8 is electrically connected to the power supply 6, then the capacitance circuitry 28 may not be present in the electrical device 8. Further, the high frequency signal may be present on the positive power rail 24 if the capacitance circuitry 28 of the electrical device 8 does not have enough capacitance to remove the high frequency signal from the positive power rail 24.

If the system 4 detects an absence of the high frequency signal on the positive power rail 24, then the electrical device 8 may be electrically connected to the power supply 6. The capacitance circuitry 28 of the electrical device 8 may have removed the high frequency signal from the positive power rail 24. The MCU 10 of the system 4 may be programmed to determine whether the electrical device 8 is electrically connected to the power supply 6 based upon the presence and/or the absence of the high frequency signal on the positive power rail 24.

The signal generation stage 12 may generate the high frequency signal using power from the MCU 10. The high frequency signal may be, for example, a constant high frequency signal. The modulation stage 14 may modulate the high frequency signal onto the positive power rail 24 between the power supply 6 and the electrical device 8. Preferably, the modulation stage 14 may modulate the high frequency signal onto the positive power rail 24 between the power supply 6 and the second end 34 of the power cable 30. As previously set forth, the second end 34 of the power cable 30 may be inserted into the power port 42 of the head unit 40 and may be in a position on the power cable 30 that may be opposite to the power port 36 of the electrical device 8.

The filter stage 16 may remove signals and/or noise other than the high frequency signal from the positive power rail 24 of the electrical device 8. The filter stage 16 may allow only the high frequency signal, if present on the positive power rail 24, to pass to the gain stage 18 and/or to the rectifier stage 20. The gain stage 18 may amplify an output of the filter stage 16 to provide a larger signal to the rectifier stage 20. The rectifier stage 20 may convert the output of the filter stage 16 and/or the gain stage 18 to a known DC level. The MCU 10 may be programmed to detect a level of the output of the rectifier stage 20 to determine if the electrical device 8 is electrically connected to the power supply 6.

In an embodiment, the MCU 10 may generate the high frequency signal which may be, for example, a square wave at a known high frequency, such as, for example, 100 kHz. The signal generation stage 12 may have one or more circuit elements to smooth the square wave high frequency signal into a triangle wave high frequency signal. In an embodiment, the signal generation stage 12 may reduce a magnitude of the triangle wave high frequency signal before the triangle wave high frequency signal may be output as a signal $V_{out}$. To reduce any effects that the high frequency signal may have on the electrical device 8, a peak-to-peak magnitude of the signal $V_{out}$ may be reduced to a value that may be less than a nominal value of a DC signal level that may be present on the positive power rail 24 between the power supply 6 and the electrical device 8. For example, the signal $V_{out}$ may have a 100 mV peak-to-peak value while the nominal value of the DC signal level on the positive power rail 24 may be, for example, +5V DC. It should be understood that the signal generation stage may have any circuit elements that may be capable of smoothing the high frequency signal, altering the frequency of the high frequency signal and/or changing the magnitude of the high frequency signal. The circuit elements of the signal generation stage 12 may be any circuit elements for modifying a high frequency signal as known to one having ordinary skill in the art.

As shown in FIGS. 1-3, the modulation stage 14 may modulate the signal $V_{out}$ onto the positive power rail 24 between the power supply 6 and the electrical device 8. Preferably, the modulation stage 14 may modulate the signal $V_{out}$ onto the positive power rail 24 between the power supply 6 and the power port 42 of the head unit 40. The modulation stage 14 may be a short circuit or an open circuit between an output of the signal generation stage 12 and the positive power rail 24. If the electrical device 8 is electrically connected to the power supply 6, then the modulation stage 14 may be a short circuit between an output of the signal generation stage 12 and the positive power rail 24. If the electrical device 8 is not electrically connected to the power supply 6, then the modulation stage 14 may be an open circuit between the output of the signal generation stage 12 and the positive power rail 24. If the modulation stage 14 is a short circuit between the output of the signal generation stage 12 and the positive power rail 24, then the capacitance circuitry 28 of the electrical device 8 may remove the signal $V_{out}$ from the positive power rail 24. The filter stage 16, the gain stage 18 and/or the rectifier stage 20 may have no signal to filter, to magnify and/or to rectify, respectively. In the case of a short circuit, the MCU 10 may be programmed to determine that the electrical device 8 may be electrically connected to the power supply 6 provided that the electrical device 8 has enough capacitance to remove the signal $V_{out}$ from the positive power rail 24. In the case of an open circuit, the MCU 10 may be programmed to determine that the electrical device 8 may not be electrically connected to the power supply 6 because the signal $V_{out}$ may be present at the output of the signal generation stage 12.

As shown in FIG. 2, the filter stage 16 may have, for example, a multi-feedback band-pass filter topology with an op-amp which may be designed to pass a range of frequencies to the gain stage 18 and/or the rectifier stage 20. The filter stage 16 may be designed to have a mid-frequency fm value that may be equivalent to a value of the high frequency signal that may be generated by the signal generation stage 12. Further, the filter stage 16 may have a high filter quality Q and/or a low bandwidth B. The filter stage 16 may allow only the high frequency signal to pass through and/or may remove unwanted and/or undesirable frequencies and/or noise. Therefore, the filter stage 16 may allow the MCU 10 to detect an existence or a non-existence of only the high frequency signal which may be directly related to the presence and/or the absence of an electrical connection between the electrical device 8 and the power supply 6. Further, the filter stage 16 may provide a set level of a gain Am which may amplify a low input signal into a larger and/or more usable output signal. In a preferred embodiment, the filter stage 16 may have resistors R26, R31 and/or R47 and/or capacitors C14, C29 and/or C30.

The op-amp of the multi-feedback band-pass filter topology may have a positive input as shown in FIG. 2. The positive input into the op-amp may be a DC bias that may be set to, for example, one-half of a power supply voltage that may be supplied to the op-amp. The DC bias of the positive input may allow for a maximum AC swing at an output of the op-amp. Further, the capacitor C30, which may be located at the output of the op-amp, may remove any DC bias and may, therefore, be relatively small. The mid-frequency fm, the gain Am, the filter quality Q and/or the bandwidth B of the multi-feedback band-pass filter topology of the filter stage 16 may be determined by the following equations:

$$fm = \frac{1}{2 \times \pi \times C29} \times \sqrt{\frac{R31 + R47}{R31 \times R47 \times R26}}$$

$$-Am = \frac{R26}{2 \times R31}$$

$$Q = \pi \times fm \times R26 \times C14$$

$$B = \frac{1}{\pi \times R26 \times C14}$$

As a result of using the multi-feedback band-pass filter topology, the only signal that may be allowed to pass through the filter stage 16 may be the high frequency signal. Therefore, if the electrical device 8 is not attached to or not electrically connected to the power supply 6, then only the high frequency signal may be output by the filter stage 16. However, if the electrical device 8 is attached to or is electrically connected to the power supply 6, then the high frequency signal may be removed by the capacitance circuitry 28 of the electrical device 8 and may not, therefore, be present at the input of the filter stage 16. As a result, the filter stage 16 has little output or no output which may indicate a lack of the high frequency signal and may indicate the presence of an electrical connection between the electrical device 8 and the power supply 6. The present invention should not be deemed as limited to a specific embodiment of the filter stage 16. The filter stage 16 may have circuit components that may be used to provide a band-pass filter as known to one having ordinary skill in the art.

As shown in FIG. 2, the gain stage 18 may have, for example, an active gain-only op-amp topology. The gain stage 18 may be provided between the filter stage 18 and the rectifier stage 20 to provide an additional gain A of the output of the filter stage 16. In an alternate embodiment, the gain stage 18 may be omitted from the circuit 2 in situations wherein the additional gain A is not desirable or required between the filter stage 16 and the rectifier stage 20. In an embodiment, a positive input of the op-amp that may be used in the gain stage 18 may be set to one-half of the power supply voltage that may be supplied to the op-amp which may allow for a maximum AC swing. As shown in FIG. 2, the gain stage 18 may have resistors R27 and/or R32 and/or a capacitor C28. The capacitor C28, which may be located at the output of the op-amp, may remove any DC bias. The additional gain A of the op-amp topology of the gain stage 18 may be determined by the following equation:

$$A = \frac{R27}{R32}$$

As a result of using the op-amp topology of the gain stage 18, the generated high frequency signal that may be output by the filter stage 16 may be amplified prior to its conversion in the rectifier stage 20. The present invention should not be deemed as limited to a specific embodiment of the gain stage 18. The gain stage 18 may have circuit components that may be used to amplify the output of the filter stage 16 as known to one having ordinary skill in the art.

As shown in FIG. 2, the rectifier stage 20 may have, for example, an active full-wave rectifier topology. The active full-wave rectifier topology may provide a more accurate and/or temperature independent output as compared to, for example, a diode bridge rectifier topology. The rectifier stage 20 may convert the high frequency signal to a corresponding DC level. Therefore, if the filter stage 16 outputs the high frequency signal, then the rectifier stage 20 may convert the high frequency signal into a known DC level. However, if the filter stage 16 does not output the high frequency signal, then the rectifier stage 20 may not have an AC signal to convert. When the filter stage 16 does not output the high frequency signal, then the rectifier stage 20 may output a known nominal state, such as, for example, a ground level as shown in FIG. 2. Therefore, detecting the level of the output of the rectifier stage 20 may be indicative of the presence and/or the absence of an electrical connection between the electrical device 8 and the power supply 6. As shown in FIG. 2, the rectifier stage 20 may have resistors R23, R24, R28, R33, R34 and/or R48 and/or a capacitor C16. The capacitor C16 of the rectifier stage 20 may be used as an integrating capacitor that may have the output DC voltage proportional to the average input voltage. The capacitor C16 and the resistor R28 smooth the high frequency signal into an appropriate DC value. In an embodiment, values of the resistors R23, R24, R28, R33, R34 and/or R48 of the active full-wave rectifier topology of the rectifier stage 20 may be determined by the following equation:

$$R33=R23=R24=R28=R48=2\times R34$$

The present invention should not be deemed as limited to a specific embodiment of the rectifier stage 20. The rectifier stage 20 may have circuit components that may be used to convert the output of the filter stage 16 and/or the gain stage 18 to a DC level as known to one having ordinary skill in the art.

The output of the rectifier stage 20 may be a DC value that may be sent to and/or processed by an analog circuit, such as, for example, an analog comparator, an A/D converter and/or the like. As discussed above, the output of the rectifier stage 20 may be, for example, either the known DC level or the known nominal state, such as, for example, the ground level. A threshold value may be set between the ground level and the known DC level, and the MCU 10 may be programmed with the threshold value to determine if the electrical device 8 is electrically connected to the power supply 6. In a preferred embodiment, the output of the rectifier stage 20 may be input into an A/D converter input of the MCU 10. The MCU 10 may be a component of the alarm system and/or may initiate an alarm that may be indicative of the security and/or the operability of the electrical device 8. The security and/or the operability of the electrical device 8 may be related to the existence of an electrical connection between the electrical device 8 and the power supply 6. The system 4 may be used in a situation wherein the power supply 6 is providing power to the electrical device 8 over the power cable 30. Further, the system 4 may be used in a situation wherein the power supply 6 is not providing power to the electrical device 8, such as, for example, when the power supply 6 is cycling power between an on state and an off state that may result in prolonging a battery life of the electrical device 8.

In an embodiment, a user of the system 4 may connect the power cable 30 between the power supply 6 and the electrical device 8 which may create an electrical connection. The electrical connection may be passive or active because the power supply 6 may or may not be transmitting power to the electrical device. The system 4, using the stages of the circuit 2, may continuously monitor the electrical connection. Provided that the capacitance circuitry 28 of the electrical device 8 has enough capacitance to remove the high frequency signal from the positive power rail, the system 4 may determine that the electrical connection exists. However, if the power cable 30 becomes unplugged from the electrical device 8 and/or the power supply 6, then the high frequency signal may exist at the input of the filter stage 16, and the system 4 may determine that the electrical connection does not exist. Further, if the power cable 30 is cut or damaged, the high frequency signal may exist at the input of the filter stage 16, and the system 4 may determine that the electrical connection does not exist. When the MCU 10 of the system 4 determines that the electrical connection does not exist, the MCU 10 may be programmed to initiate an alarm. The alarm may have audible indicators and/or visual indicators that may notify the user of the system 4 that the electrical device 8 may be unplugged, stolen and/or at risk of battery failure and/or malfunction. When the system 4 detects the electrical connection, the user of the system 4 may be assured that the electrical device 8 may be electrically connected to the power supply 6 and may further be functional and/or operational while on display.

Figure 5:
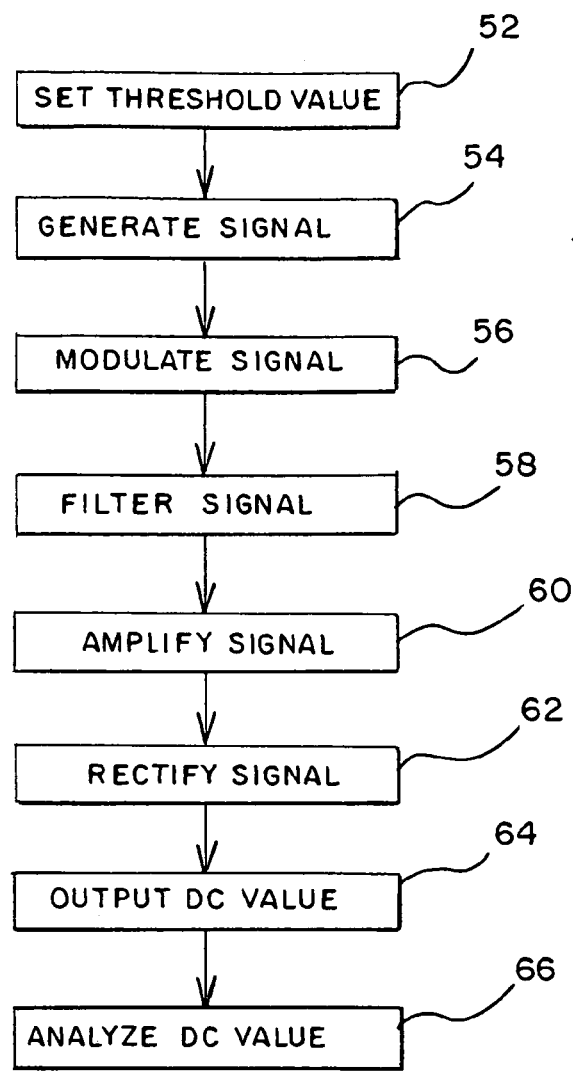
FIG. 5 illustrates a method for detecting an electrical connection between an electrical device and a power supply in an embodiment of the present invention.

Referring now to FIG. 5, a method 50 for detecting an electrical connection between the electrical device 8 and the power supply 6 is generally shown. The method 50 shown in FIG. 5 allows a user of the system 4 to program the threshold value into the MCU 10, as shown beginning at step 52. As previously set forth, the threshold value may be, for example, a value between the ground level and the known DC level. In an embodiment, either the known DC level or the ground level may be output by the rectifier stage 20 depending on whether an electrical connection exists between the power supply 6 and the electrical device 8. The user may connect the power cable 30 between the power supply 6 and the electrical device 8. The MCU 10 and/or the circuit 2 may generate the high frequency signal as shown beginning at step 54. The MCU 10 and/or the circuit 2 may modulate the high frequency signal onto the positive power rail 24 between the power supply 6 and the electrical device 8 as shown beginning at step 56.

At this point, the high frequency signal may be filtered and/or removed from the positive power rail 24 by the capacitance circuitry 28 of electrical device 8. Alternatively, if the electrical connection does not exist, the high frequency signal may not be filtered and/or removed from the positive power rail 24.

The MCU 10 and/or the circuit 2 may filter the output of the signal generation stage 14 beyond the modulation stage 14 to remove frequencies other than the high frequency signal as shown beginning at step 58. The MCU 10 and/or the circuit 2 may amplify the high frequency signal that may be output by the filter stage 16 as shown beginning at step 60. The MCU 10 and/or the circuit 2 may rectify and/or may convert the high frequency signal into the known DC level as shown beginning at step 62. The rectifier stage 20 may output the known DC level or the ground level to an A/D converter of the MCU 10 as shown beginning at step 64. The MCU 10 may analyze and/or may detect the known DC level and/or the ground level as shown beginning at step 66.

Figure 6:
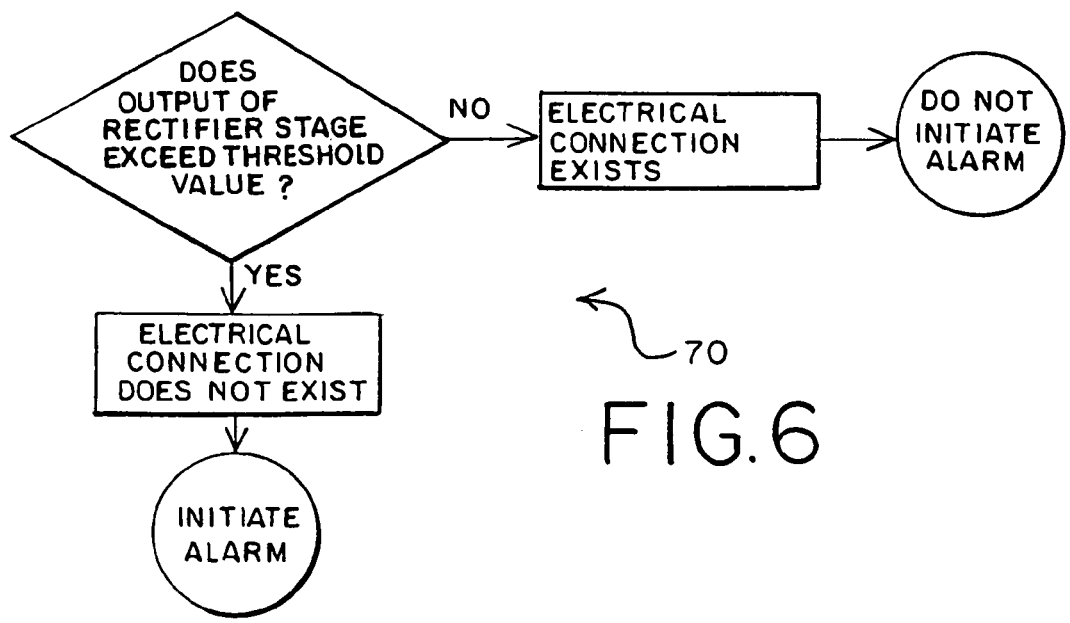
FIG. 6 illustrates a decision tree diagram for detecting an electrical connection between an electrical device and a power supply in an embodiment of the present invention.

FIG. 6 illustrates logic 70 that may be programmed into the MCU 10 to instruct the MCU 10 how to proceed based upon the output of the rectifier stage 20. The known DC level may, for example, exceed the threshold value. Therefore, the MCU 10 may be programmed to initiate the alarm after detection of the known DC level. The alarm may indicate that the electrical connection no longer exists.

If the high frequency signal is filtered and/or removed from the positive power rail 24 by the capacitance circuitry 28, the output of the filter stage 16, the gain stage 18 and/or the rectifier stage may be the ground level which may not, for example, exceed the threshold value that may be set at step 52. Therefore, the MCU 10 may be programmed to determine that the electrical connection exists and no alarm may be initiated.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

We claim:

1. A system for detecting an electrical connection between an electrical device having a power port and a power supply wherein a disruption of the electrical connection between the power port of the electrical device and the power supply initiates an alarm condition wherein the system modulates a high frequency signal onto a positive power rail and a ground power rail wherein the positive power rail connects the power supply to the electrical device and the ground power rail connects the electrical device to the power supply and further wherein the system monitors the positive power rail to determine if the high frequency signal is removed from the positive power rail by the electrical device, the system comprising:

a microcontroller unit wherein the microcontroller unit generates the high frequency signal and;

a circuit defined by the positive power rail and the ground power rail wherein a capacitance circuit associated with the electrical device is located in between and connects to the positive power rail and the ground power rail wherein detection of the absence of the high frequency signal indicates that both the positive power rail and the ground power rail are electrically connected between the electrical device and the power supply wherein the circuit has a signal generation stage to generate the high frequency signal; a modulation stage to connect the signal generation stage to the positive power rail to transmit the high frequency signal onto the positive power rail between the electrical device and the power supply; a filter stage connected to the positive power rail to filter frequencies other than the high frequency signal from the positive power rail and to transmit the high frequency signal from the positive power rail; and a rectifier stage to convert the high frequency signal transmitted from the positive power rail to a known DC level;

a tether having a first end and a second end wherein the first end is connected to the power supply; and a head unit integrally formed with the second end of the tether wherein the head unit has a power port that attaches to the electrical device.

2. The system of claim 1 wherein the signal generation stage reduces a magnitude of the high frequency signal.

3. The system of claim 1 further comprising:

a short circuit between the signal generation stage and the positive power rail.

4. The system of claim 1 further comprising:

an open circuit between the signal generation stage and the positive power rail.

5. The system of claim 1 further comprising:

a multi-feedback band-pass filter associated with the filter stage wherein the multi-feedback band-pass filter has an op-amp to pass a range of frequencies to the rectifier stage wherein the range of frequencies has a frequency of the high frequency signal.

6. The system of claim 1 further comprising:

a gain stage between the filter stage and the rectifier stage wherein the gain stage has an active gain-only op-amp to amplify a magnitude of the high frequency signal.

7. The system of claim 1 further comprising:

an active full-wave rectifier associated with the rectifier stage.

8. The system of claim 1 further comprising:

a microcontroller unit to integrate the stages of the circuit.

9. A system for detecting an electrical connection between an electrical device and a power supply having a positive power rail and a ground power rail wherein the positive power rail connects the power supply to the electrical device and the ground power rail connects the electrical device to the power supply wherein the power supply transmits DC power to the electrical device and further wherein the electrical device has a capacitance circuit that removes a high frequency signal transmitted to the electrical device via the positive power rail when the electrical device is electrically connected to the power supply, the system comprising:

a head unit having a power port wherein the head unit attaches to the electrical device;

a tether attached to the head unit wherein the tethers connects the positive power rail and the ground power rail between the power supply and the power port of the head unit;

a microcontroller unit that generates the high frequency signal; and a circuit having the capacitance circuit located in between and connected to the positive power rail and the ground power rail wherein the capacitance circuit removes a high frequency signal transmitted to the electrical device through the positive power rail when the electrical device is electrically connected to the power supply wherein detection of the absence of the high frequency signal indicates that the positive power rail and the ground power rail are electrically connected between the electrical device and the power supply wherein the circuit is integrated with the microcontroller unit wherein the circuit changes a magnitude of the high frequency signal and modulates the high frequency signal onto the positive power rail between the power supply and the electrical device wherein the circuit removes frequencies other than the high frequency signal from the positive power rail wherein the circuit converts the high frequency signal on the positive power rail to a known DC level and outputs the known DC level to the microcontroller unit wherein the circuit outputs a nominal level to the microcontroller unit when the high frequency signal is removed by the capacitance circuitry of the electrical device wherein the microcontroller unit detects an absence of the electrical connection between the power supply and the electrical device when the output of the circuit is the known DC level wherein the microcontroller unit detects a presence of the electrical connection between the power supply and the electrical device when the output of the circuit is the nominal level.

10. The system of claim 9 further comprising:
a threshold value between the known DC level and the nominal level programmed into the microcontroller unit for detecting the electrical connection between the power supply and the electrical device.

11. The system of claim 9 wherein the circuit amplifies the high frequency signal on the positive power rail before converting the high frequency signal to the known DC level.

12. The system of claim 9 wherein the high frequency signal has a peak-to-peak magnitude that is less than a nominal value of the DC voltage transmitted from the power supply to the electrical device.

13. The system of claim 9 further comprising:
an alarm initiated by the microcontroller unit following detection of the electrical connection between the power supply and the electrical device.

14. A method for detecting an electrical connection between a power supply and an electrical device wherein a positive power rail extends from the power supply to the electrical device and a ground power rail extends from the electrical device to the power supply wherein a capacitance circuit is situated between and connected to the positive power rail and the ground power rail wherein the electrical device has a first power port wherein a microcontroller unit monitors the positive power rail, the method comprising the steps of:
attaching a head unit having a second power port to a surface of the electrical device;
attaching a power cable between the second power port of the head unit and the first power port of the electrical device;
tethering the head unit to the power supply wherein the electrical connection between the electrical device and the power supply is maintained while the electrical device is moved within an area around the power supply;
generating a high frequency signal;
modulating the high frequency signal onto the positive power rail and the ground power rail;
filtering the high frequency signal on the positive power rail to detect the high frequency signal on the positive power rail;
rectifying the high frequency signal to convert the high frequency signal to a first DC level;
removing the high frequency signal from the positive power rail by the capacitance circuit; and
detecting the absence of the high frequency signal to indicate that both the positive power rail and the ground power rail are electrically connected between the electrical device and the power supply.

15. The method of claim 14 further comprising the step of:
amplifying the high frequency signal.

16. The method of claim 14 further comprising the step of:
smoothing the high frequency signal.

17. The method of claim 14 further comprising the step of:
outputting the first DC level wherein the first DC level provides an indication that the electrical connection does not exist between the power supply and the electrical device.

18. The method of claim 14 further comprising the step of:
outputting a second DC level if the high frequency signal is removed by the electrical device wherein the second DC level provides an indication of the electrical connection between the power supply and the electrical device.

19. The method of claim 14 further comprising the step of:
initiating an alarm after detecting the first DC level.

20. The circuit of claim 1 further comprising:
a power cable attached to the power port of the head unit and the power port of the electrical device wherein the modulation stage modulates the high frequency signal onto the positive power rail between the power supply and the power port of the electrical device.

21. A method for monitoring an electrical connection between a power supply and an electrical device having a first power port wherein a positive power rail and a ground power rail connect the power supply to the electrical device wherein a capacitance circuit associated with the electrical device is situated in between and connects to the positive power rail and the ground power rail, the method comprising the steps of:
attaching a head unit having a second power port to a surface of the electrical device;
attaching a power cable between the second power port of the head unit and the first power port of the electrical device;
tethering the head unit to the power supply wherein the electrical connection between the electrical device and the power supply is maintained while the electrical device is moved within an area around the power supply;
generating a high frequency signal;
passing the high frequency signal to the electrical device;
monitoring the electrical connection for the capacitance circuitry of the electrical device by detecting filtering of the high frequency signal;
removing the high frequency signal from the positive power rail by the capacitance circuit; and
detecting the absence of the high frequency signal to indicate that both the positive power rail and the ground power rail are electrically connected between the electrical device and the power supply.

22. The method of claim 21 further comprising the step of:
smoothing the high frequency signal.

23. The method of claim 21 further comprising the step of:
amplifying the high frequency signal.

24. The method of claim 21 further comprising the step of:
generating an alarm in response to the detection of the high frequency signal.

25. A system having a circuit used for detecting an electrical connection between a consumer electronic device and a power supply, the system comprising:
a positive power rail and a ground power rail wherein the positive power rail and the ground power rail form the circuit that electrically connects the consumer electronic device to the power supply wherein a capacitance circuit associated with the consumer electronic device is located in between and connects to the positive power rail and the ground power rail wherein the capacitance circuit removes a high frequency signal transmitted to the electrical device via the positive power rail when the electrical device is electrically connected to the power supply wherein detection of the absence of the high frequency signal indicates that both the positive power rail and the ground power rail are electrically connected between the electrical device and the power supply;
a head unit with a power port wherein the head unit is attached to the consumer electronic device;

a tether attached to the head unit wherein the tether transmits power from the power supply to the consumer electronic device through the power port of the head unit;

a power cable connected to the power port of the head unit wherein the power cable establishes the electrical connection between the head unit and the consumer electronic device;

a signal generation stage on the circuit that generates a high frequency signal wherein the high frequency signal is modulated onto the electrical connection; and a microcontroller unit which monitors the electrical connection for the capacitance circuitry of the consumer electronic device by detecting filtering of the high frequency signal.

26. The circuit of claim 25 further comprising:

an alarm activated by detection of the high frequency signal.

27. The circuit of claim 25 further comprising:

a display between the electrical device and the power supply.

28. The system of claim 1 wherein the tether has a coiled portion between the first end and the second end.

* * * * *